(12) United States Patent
Numata

(10) Patent No.: US 12,726,153 B2
(45) Date of Patent: Sep. 1, 2026

(54) SOLAR ENERGY UTILIZATION SYSTEM

(71) Applicant: Machiokoshi Energy Co., Ltd., Kakogawa (JP)

(72) Inventor: Shoji Numata, Kakogawa (JP)

(73) Assignee: Machiokoshi Energy Co., Ltd., Kakogawa (JP)

( * ) Notice: Subject to any disclaimer, the term of this patent is extended or adjusted under 35 U.S.C. 154(b) by 0 days.

(21) Appl. No.: 19/294,289

(22) Filed: Aug. 8, 2025

(65) Prior Publication Data

US 2026/0051846 A1 Feb. 19, 2026

(30) Foreign Application Priority Data

Aug. 15, 2024 (JP) ................................ 2024-135529

(51) Int. Cl.

| | |
|---|---|
| ***H02S 40/44*** | (2014.01) |
| ***F24S 10/70*** | (2018.01) |
| ***H02S 20/23*** | (2014.01) |
| *F24S 70/12* | (2018.01) |
| *F24S 80/20* | (2018.01) |
| *H10K 30/40* | (2023.01) |

(52) U.S. Cl.

CPC .............. *H02S 40/44* (2014.12); *F24S 10/70* (2018.05); *H02S 20/23* (2014.12); *F24S 70/12* (2018.05); *F24S 80/20* (2018.05); *H10K 30/40* (2023.02)

(58) Field of Classification Search

CPC ........ H02S 40/44; H02S 20/23; H02S 40/425; F24S 10/70; F24S 70/12; F24S 80/20; F24S 20/00; F24S 20/40; F24S 80/30; F24S 2020/17; H10K 30/40; H10K 30/50

See application file for complete search history.

(56) References Cited

U.S. PATENT DOCUMENTS

2016/0161152 A1* 6/2016 Solomon ................ F24S 80/30 126/643

FOREIGN PATENT DOCUMENTS

| | | | | |
|---|---|---|---|---|
| CN | 114499405 | A | | 5/2022 |
| CN | 219288074 | U | | 6/2023 |
| CN | 219735641 | U | * | 9/2023 |
| CN | 117500296 | A | | 2/2024 |
| JP | 2000-64946 | A | | 3/2000 |
| JP | 2011-222824 | A | | 11/2011 |

(Continued)

OTHER PUBLICATIONS

English machine translation of CN-219735641-U (Year: 2023).*

*Primary Examiner* — Angelo Trivisonno
(74) *Attorney, Agent, or Firm* — Yokoi & Co., U.S.A.; Toshiyuki Yokoi

(57) ABSTRACT

A solar energy utilization system is provided with: a Perovskite solar cell part 12 that converts light energy of sunlight into electrical energy; a solar water heater heat-collection plate 14 that is disposed below the Perovskite solar cell part 12, and that collects heat obtained from the sunlight that has passed through the Perovskite solar cell part 12; a casing 20 for housing the Perovskite solar cell part 12 and the solar water heater heat-collection plate 14; a tempered glass part 16 that is provided within the casing 20, and on which the Perovskite solar cell part 12 is placed; and a flow path part 18 that is provided within the casing 20 in contact with the solar water heater heat-collection plate 14, and that allows fluid to flow to exchange heat collected by the solar water heater heat-collection plate 14.

1 Claim, 7 Drawing Sheets

(56) References Cited

FOREIGN PATENT DOCUMENTS

| | | | |
|---|---|---|---|
| JP | 2016-57052 | A | 4/2016 |
| WO | 2019/186161 | A | 10/2019 |

* cited by examiner 18a
20
18a
18b
18c 12
16
14
17
20
18
18c
18b
13

SOLAR ENERGY UTILIZATION SYSTEM

CROSS-REFERENCE TO RELATED APPLICATIONS

This patent specification is based on Japanese patent application, No. 2024-135529 filed on Aug. 15, 2024 in the Japan Patent Office, the entire contents of which are incorporated by reference herein.

TECHNICAL FIELD

The present invention relates to a solar energy utilization system.

BACKGROUND OF THE INVENTION

As technology using solar energy, a solar water heater and a solar power generation system have conventionally been installed separately. As technology related to the present invention, for example, Patent Document 1 discloses a synergistic solar water heater comprising: a water-heater main body that has several heat exchange tubes and a hot-water manifold connecting these heat exchange tubes; a frame that is externally fitted around the water-heater main body; a first reflective plate and a second reflective plate that are symmetrically provided on either side of the frame; two insulating layers that are respectively provided on the back sides of the first reflective plate and the second reflective plate; two protective covers that are respectively provided on the two insulating layers; two rotation drivers that are respectively provided on either side of the frame, respectively joining the bottom edges of the first reflective plate and the second reflective plate, and that respectively drive the first reflective plate and the second reflective plate to rotate; and a solar-light tracking controller that electrically connects the two rotation drivers and controls each of the two rotation drivers in accordance with solar-light illumination direction to drive the first reflective plate and the second reflective plate to rotate into a light-receiving reflection angle, whereby solar light is reflected onto these heat exchange tubes, the internal water source of which flows through these heat exchange tubes, exchanges heat to be heated to hot water, and then is collected into the hot-water manifold, and that when there is no solar light, controls the two rotation drivers to simultaneously drive and rotate the first reflective plate and the second reflective plate such that the reflective plates are stacked on and cover the water-heater main body to form a layered protective cover for the water-heater main body.

Furthermore, Patent Document 2 discloses a solar panel-floor integrated hot-water supply structure in which the floor of a conventional solar water heater is formed by covering it with solar panels, and the upper water tank is formed of a transparent body such as glass, so that water in the water tank is heated by the heat absorption effect of the black color of the solar panel, while the original function, that is, generating power is carried out.

PRIOR ART

Patent Documents

Patent Document 1: JP 2016-57052A
Patent Document 2: JP 2000-64946A

SUMMARY OF THE INVENTION

Problem to be Solved by the Invention

The above-described Patent Documents 1 and 2 disclose a configuration in which a solar water heater and solar cells are used in combination, but is silent as to a method of using solar cells and a solar water heater stacked together to produce a synergistic effect.

The present invention is directed to providing a solar energy utilization system that enables efficient use of solar energy through the synergistic effects of solar cells and solar water heaters.

Means for Solving the Problems

A solar energy utilization system according to the present invention includes: a Perovskite solar cell part that converts light energy of sunlight into electrical energy; a solar water heater heat-collection plate that is disposed below the Perovskite solar cell part, that collects heat obtained from the sunlight that has passed through the Perovskite solar cell part, and that is constituted from black aluminum; a casing for housing the Perovskite solar cell part and the solar water heater heat-collection plate; an air layer that is provided within the casing between a tempered glass part on which the Perovskite solar cell part is placed and the solar water heater heat-collection plate; and a flow path part that is provided in the casing in contact with the solar water heater heat-collection plate, and that allows fluid to flow to exchange heat collected by the solar water heater heat-collection plate. The flow path part, being a flow path that spreads throughout an entire area of the solar water heater heat-collection plate, has a large pipe that extends to left and right in a plan view, functioning as a main pipe, medium pipes that extend vertically and horizontally, constituting a larger mesh lattice, and small pipes that extend vertically and horizontally, constituting a smaller mesh lattice. Fluid flowing through the large pipe, the medium pipes, and the small pipes is oil.

Effects of the Invention

With the present invention, solar energy can be efficiently utilized through the synergistic effects of solar cells and solar water heaters.

DETAILED DESCRIPTION OF THE INVENTION

Figure 1:
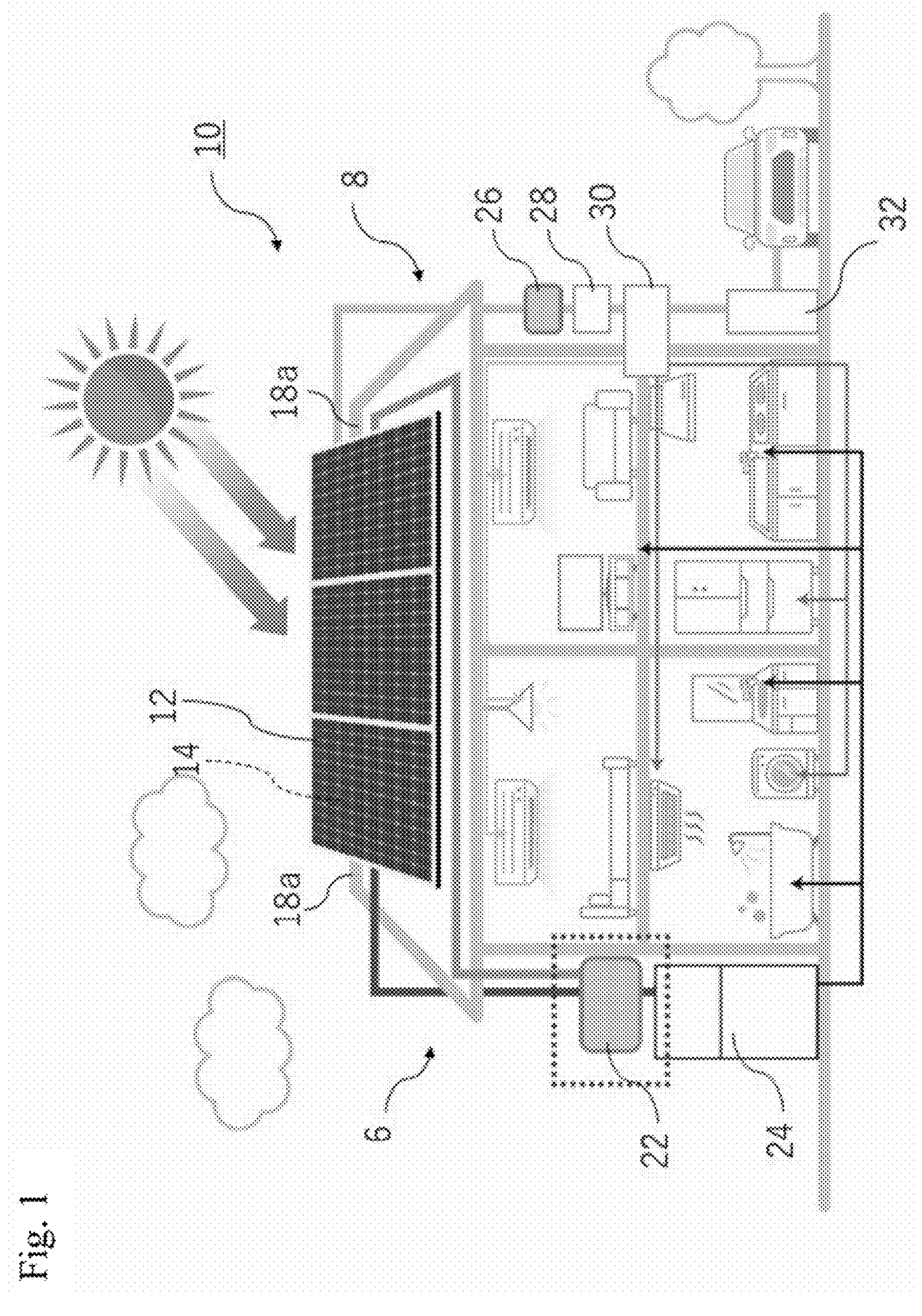
FIG. 1 is a diagram representing a solar energy utilization system of an embodiment involving the present invention.

Hereinafter, a mode of embodying the present invention is explained in detail with reference to the accompanying drawings. In the following, like elements are assigned the same reference numerals in all the figures in the drawings, and a repeated description is omitted. In addition, in the description in the text, the reference numerals mentioned previously are used if necessary.

Figures 2A, 2B:
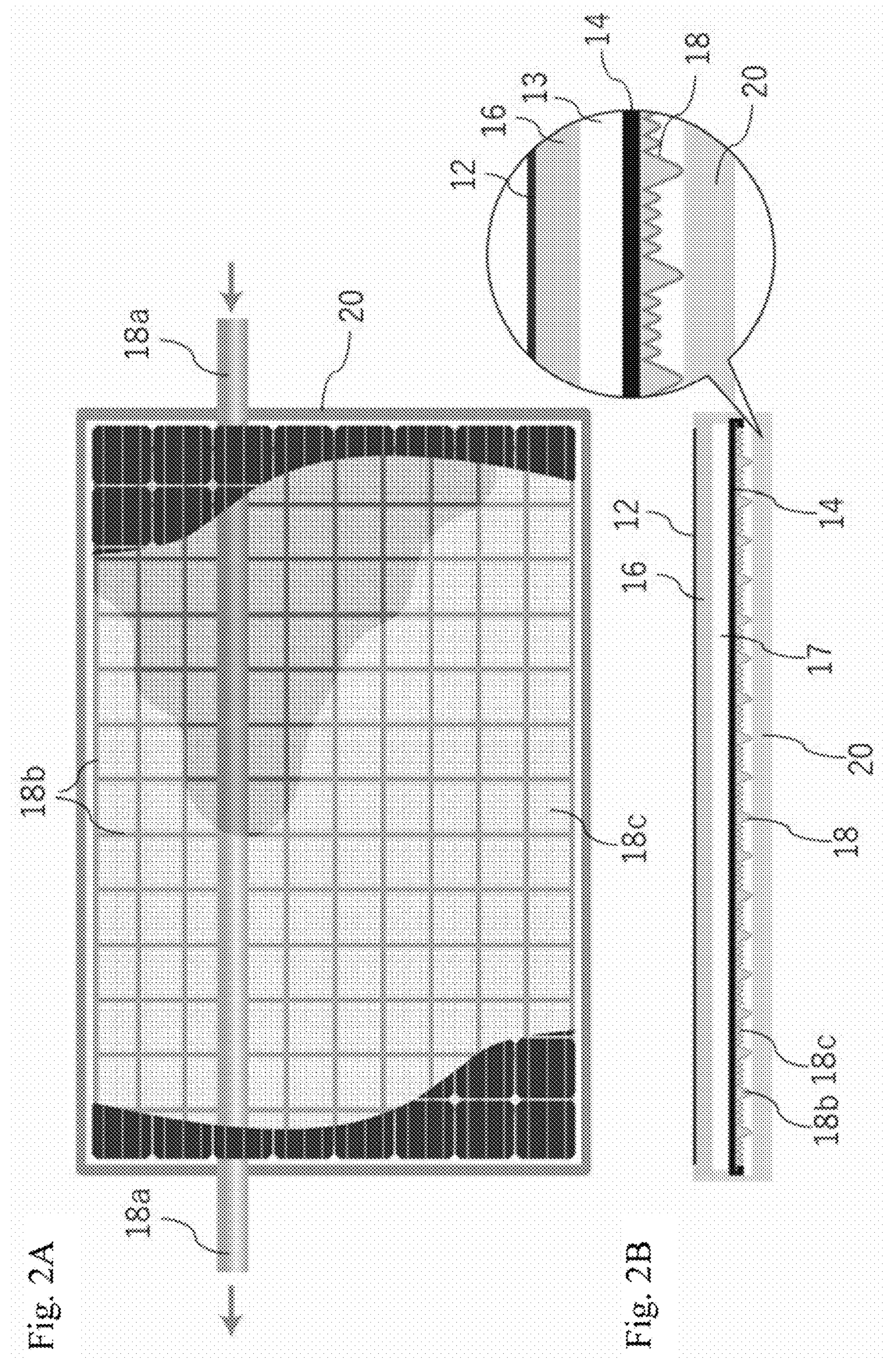
FIGS. 2A and 2B are diagrams representing a casing for housing a Perovskite solar cell part and a solar water heater heat-collection plate in the solar energy utilization system of the embodiment involving the present invention.

FIG. 1 is a diagram representing a solar energy utilization system 10 of an embodiment involving the present invention. FIGS. 2A and 2B are diagrams representing a casing 20 for housing a Perovskite solar cell part 12 and a solar water heater heat-collection plate 14 in the solar energy utilization system 10 of the embodiment involving the present invention.

FIGS. 3A to 3C and 4A to 4B are diagrams for explaining advantages of utilizing a Perovskite solar cell part 12 in the solar energy utilization system 10 of the embodiment involving the present invention.

The solar energy utilization system 10 is a system that utilizes solar energy to acquire thermal energy and at the same time to acquire electrical energy. The solar energy utilization system 10 includes: a Perovskite solar cell part 12 that converts light energy from sunlight into electrical energy; a solar water heater heat-collection plate 14 that collects heat from sunlight; a tempered glass part 16; a flow path part 18; a casing 20; a heat pump 22; an insulated hot water tank 24; a junction box 26; a power conditioner 28; a distribution board 30; and a storage battery 32.

In the Perovskite solar cell part 12, Perovskite crystals on a substrate absorb light and generate power. The Perovskite solar cell part 12 has a structure in which thin films are layered on top of each other, and is made by applying materials onto the substrate in a manner similar to painting, enabling utilization of low-cost substrates such as films. Since the substrate is a film, it has the advantage of being light and bendable.

The Perovskite solar cell part 12 has a Perovskite layer in the middle that absorbs light and generates positive and negative charges, and this Perovskite layer is sandwiched between a hole transport layer that extracts positive charges and an electron transport layer that extracts negative charges, and is further sandwiched between two electrodes.

The Perovskite solar cell part 12 can be bent or folded, making it adaptable to various shapes, its expected manufacturing cost is about one-third to one-fifth of that in silicon-based photovoltaic power generation, and with high energy conversion efficiency, it can generate power even under low light.

Figure 3A:
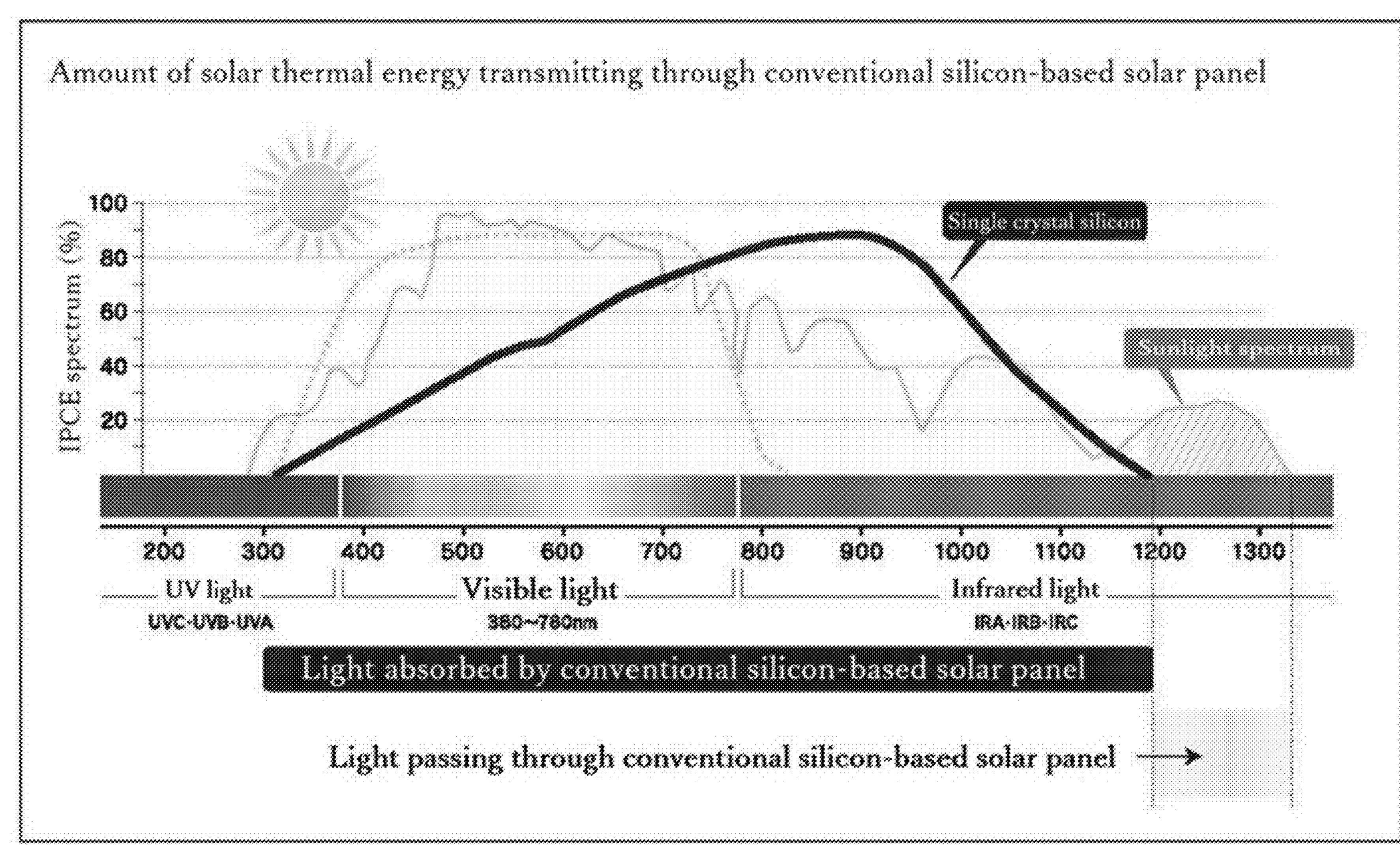
FIGS. 3A to 3C are diagrams for explaining advantages of utilizing a Perovskite solar cell part in the solar energy utilization system of the embodiment involving the present invention.
Figure 3B:
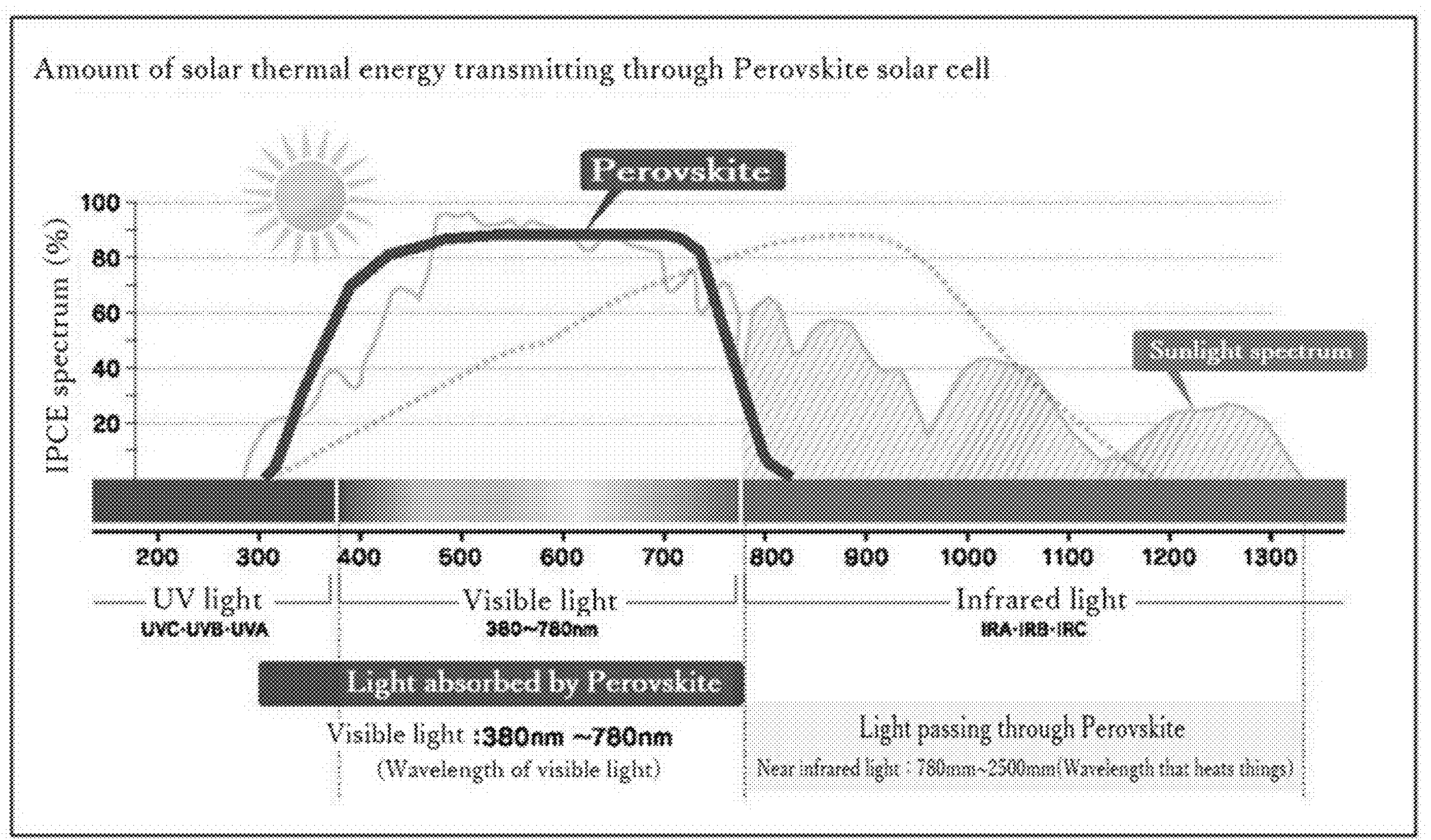

The Perovskite solar cell part 12, as illustrated in FIG. 3B, absorbs sunlight in the visible light range (380 to 780 nm) and absorbs almost no sunlight in the infrared range. Conventional silicon-based solar panels absorb sunlight in some portion of the infrared range as well, making it difficult to absorb sunlight as solar heat, whereas the Perovskite solar cell part 12 allows sunlight in the infrared range to pass through.

Figure 4A:
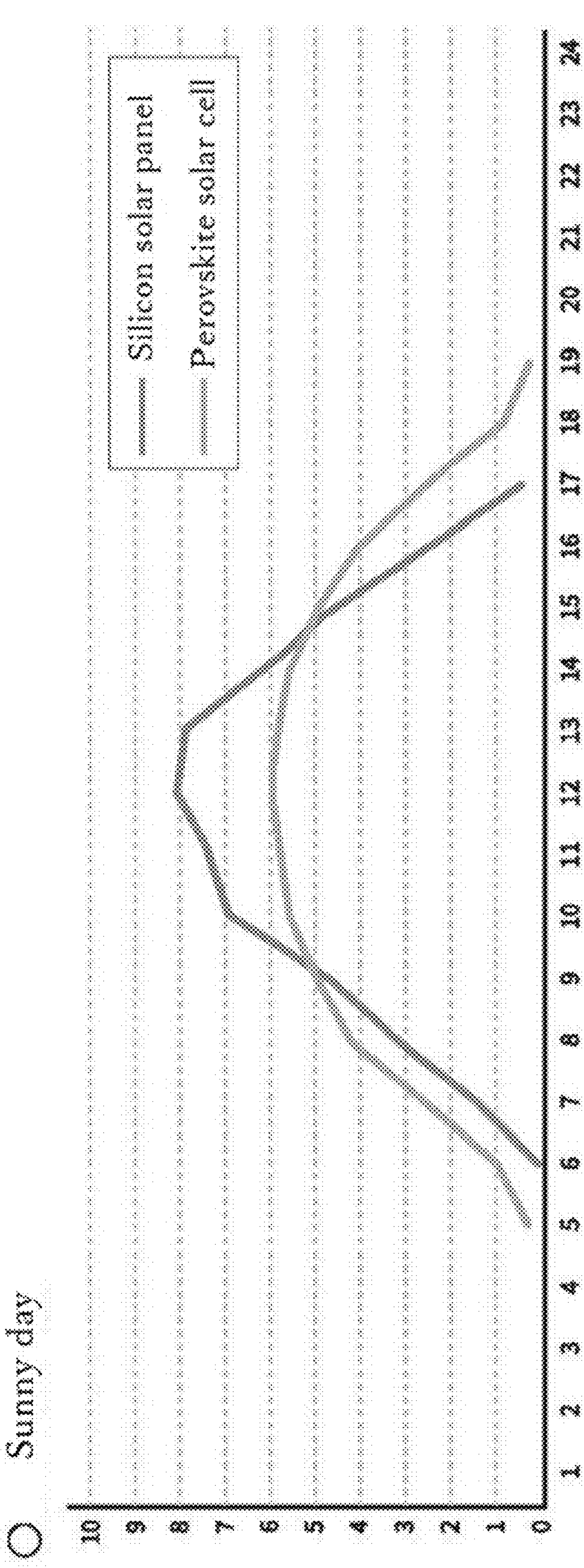
FIGS. 4A and 4B are diagrams for explaining advantages of utilizing a Perovskite solar cell part in the solar energy utilization system of the embodiment involving the present invention.
Figure 4B:
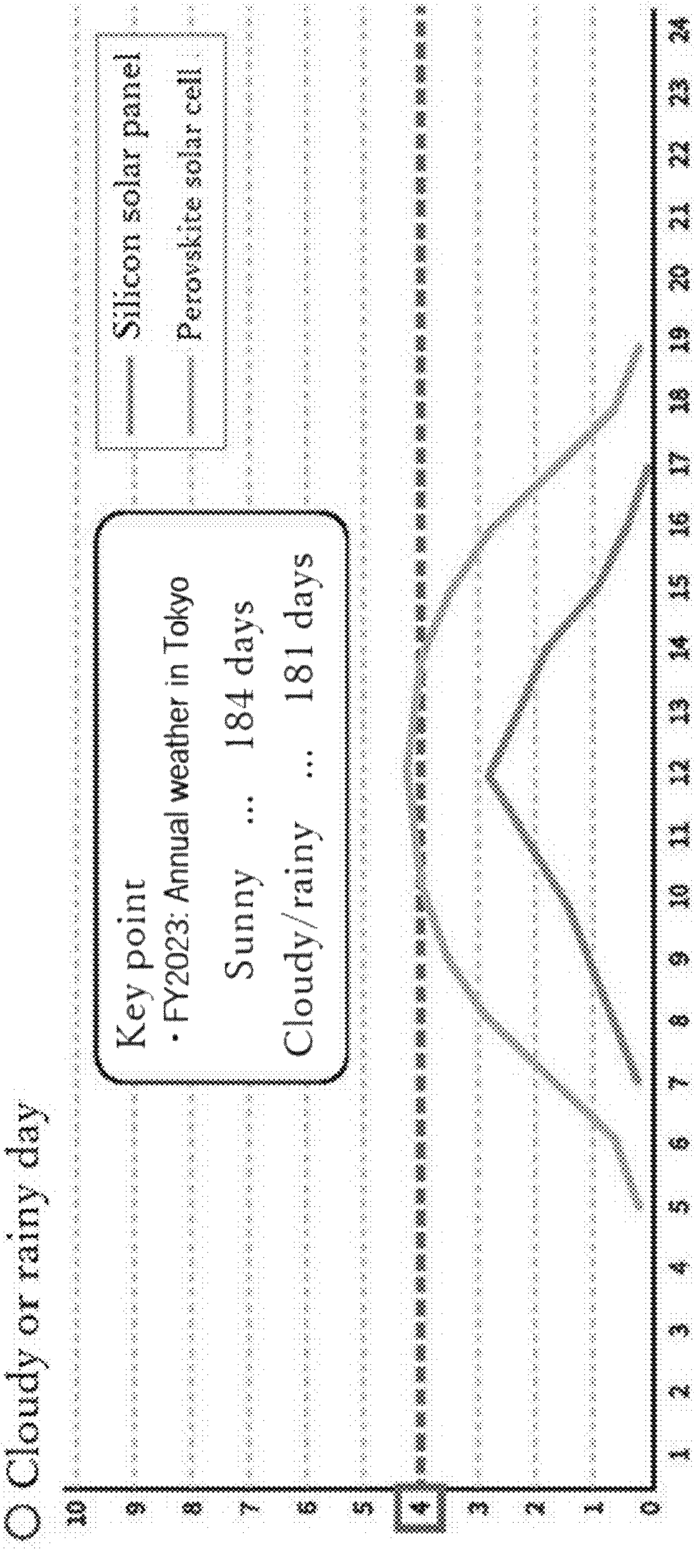

The Perovskite solar cell part 12 efficiently absorbs sunlight in the visible light range (380 to 780 nm), enabling power generation even under cloudy or rainy conditions. FIGS. 4A and 4B represent a comparison of power generation under different weather conditions on one day in Tokyo between with Perovskite solar cells and in conventional silicon-based photovoltaic power generation.

As illustrated in FIG. 4A, on a normal sunny day, larger amount of power is generated in the conventional silicon-based photovoltaic power generation, but as illustrated in FIG. 4B, on a cloudy or rainy day, with the Perovskite solar cell part 12, about three times more power is generated than in the conventional silicon-based photovoltaic power generation. According to annual weather comparisons, half of the days are sunny and half are not sunny (cloudy or rainy), so there is data indicating that the total annual power generation does not vary greatly.

The solar water heater heat-collection plate 14 is disposed below the Perovskite solar cell part 12, and has the function of collecting heat obtained from sunlight that has passed through the Perovskite solar cell part 12.

It is preferable that the solar water heater heat-collection plate 14 be constituted from a black aluminum plate. Aluminum has a specific heat of 900 (J/kg° C.), a thermal conductivity of 204 (W/mK), a melting point of 660.2 (° C.), and a specific gravity of 2.70 (g).

For comparison, iron has a specific heat of 444 (J/kg° C.), a thermal conductivity of 80 (W/mk), a melting point of 1538 (° C.), and a specific gravity of 7.87 (g), and zinc has a specific heat of 383 (J/kg° C.), a thermal conductivity of 113 (W/mK), a melting point of 419.46 (° C.), and a specific gravity of 7.14 (g).

Copper has a specific heat of 419 (J/kg° C.), a thermal conductivity of 372 (W/mK), a melting point of 1083 (° C.), and a specific gravity of 8.93 (g), and magnesium has a specific heat of 1013 (J/kg° C.), a thermal conductivity of 54 (W/mK), a melting point of 650 (° C.), and a specific gravity of 1.74 (g).

Stainless steel has a specific heat of 460 (J/kg° C.), a thermal conductivity of 16 (W/mk), a melting point of 1400 (° C.), and a specific gravity of 7.70 (g), and water (20° C.) has a specific heat of 4182 (J/kg° C.), a thermal conductivity of 0.602 (W/mK), a melting point of 0 (° C.), and a specific gravity of 1.0 (g). Considering these properties, aluminum, being of high thermal conductivity, light weight, and low cost, is presumably best-suited for heat collection plates.

The tempered glass part 16 is glass on which the Perovskite solar cell part 12 is to be placed. The tempered glass part 16 is made by subjecting normal glass (float glass) to heat treatment and then rapidly cooling it, and has wind-pressure resistance approximately 3.5 to 4 times that of float glass. It looks exactly the same as and is indistinguishable from float glass. Also, normal glass breaks sharply like a blade, whereas the tempered glass part 16 has the characteristic of shattering into small pieces.

The flow path part 18 is in contact with the solar water heater heat-collection plate 14, which is installed via an air layer 13 between itself and the tempered glass part 16, serving as a flow path for flowing fluid to exchange the heat collected by the solar water heater heat-collection plate 14. The air layer 13 is provided in order to prevent the heat collected by the solar water heater heat-collection plate 14 from being absorbed by the tempered glass part 16.

Through the flow path part 18, industrial oil flows. Industrial oil has a specific heat of 1796 (J/kg° C.), a thermal conductivity of 0.148 (W/mK), a coefficient of expansion of 0.70 (×10-3/° C.), and a specific gravity of 0.8 to 0.9 (g).

Water, depending on the temperature such as 0° C., 20° C., 80° C., and 100° C., varies in specific heat, thermal conductivity, coefficient of expansion, and specific gravity. At 0° C., the specific heat (J/kg° C.) is 4217, the thermal conductivity (W/mK) is 0.569, the coefficient of expansion (×10-3/° C.) is −0.06, and the specific gravity (g) is 1.0. At 20° C., the specific heat (J/kg° C.) is 4182, the thermal conductivity (W/mK) is 0.602, the coefficient of expansion (×10-3/° C.) is 0.65, and the specific gravity (g) is 1.0.

At 80° C., the specific heat (J/kg° C.) is 4196, the thermal conductivity (W/mk) is 0.672, the coefficient of expansion (×10-3/° C.) is 0.65, and the specific gravity (g) is 1.0. At 100° C., the specific heat (J/kg° C.) is 4215, the thermal conductivity (W/mK) is 0.682, the coefficient of expansion (×10-3/° C.) is 0.78, and the specific gravity (g) is 1.0. In this way, with the specific heat of oil being less than half that of water, oil absorbs heat more quickly, and weighs less than water.

The flow path part 18, as illustrated in FIGS. 2A and 2B, is provided with: a large pipe 18*a* that, in such a manner as to cover substantially the entire area of the solar heater heat-collection plate 14, extends to the left and right in a plan view, functioning as a main pipe; medium pipes 18*b* that extend vertically and horizontally, constituting a large mesh lattice; and small pipes 18*c* that extend vertically and horizontally, constituting a small mesh lattice.

The flow path part 18 may be constituted from any material having an appropriate strength, such as a mixture of magnesium, zinc, and aluminum, but may of course be constituted from other materials.

The casing 20 is a case that accommodates: the Perovskite solar cell part 12; the air layer 13; the solar water heater heat-collection plate 14; the tempered glass part 16; and the flow path part 18.

The casing 20 has a tray-like form with an open top. As illustrated in the cross-sectional view in FIG. 2B, the tempered glass part 16 and the solar water heater heat-collection plate 14 are fixed directly to the case body 20. On the obverse surface (upper surface) of the tempered glass part 16, the Perovskite solar cell part 12 is placed and attached, and to the reverse surface (lower surface) of the solar water heater heat-collection plate 14, the flow path part 18 is attached in contact.

It is preferable that the casing 20 be constituted from a material having an appropriate strength, such as a composite board of aluminum alloy and polyethylene resin, but may of course be constituted from other materials.

The heat pump 22 includes: a compressor that compresses the refrigerant to turn it into high-temperature, high-pressure gas; a condenser in which the compressed refrigerant releases heat to turn into liquid; an expansion valve that rapidly expands the refrigerant to reduce its temperature and pressure; and an evaporator in which the refrigerant absorbs the surrounding heat to turn back into gas.

In the heat pump 22, an evaporation process in which the refrigerant absorbs the surrounding heat in the evaporator to turn from liquid into gas, a compression process in which the gaseous refrigerant is compressed by the compressor to turn into high-temperature, high-pressure gas, a condensation process in which the high-temperature, high-pressure gas releases heat in the condenser to turn into liquid, and an expansion process in which the liquid refrigerant passes through the expansion valve and rapidly expands to turn into a low-temperature, low-pressure state are repeated, allowing heat to be transferred efficiently.

The insulated hot water tank 24 is a tank for storing hot water heated by the heat pump 22. The insulated hot water tank 24 can be constituted from stainless steel (for example, SUS444) or plastic-lined steel plate. This makes the tank corrosion-resistant and enabled for supply of clean hot water.

Here, a configuration including solar water heater heat-collection plate 14, the flow path part 18, the heat pump 22, and the insulated hot water tank 22 is referred to as a solar hot water heater 6.

The junction box 26 is one of the important components of the solar power generation system, and is a device for connecting the Perovskite solar cell part 12 and the power conditioner 28. The junction box 26 collects the generated DC power from the Perovskite solar cell part 12 and sends it to the power conditioner 28. Thereby the DC power is converted into AC power.

The junction box 26 has the function of adjusting voltage variations when combining power from multiple Perovskite solar cell parts 12. The junction box 26, incorporating safety devices such as switches and lightning protection elements, has the functions of controlling electricity flow and protecting the device from lightning strikes.

The power conditioner 28 automatically finds the combination of voltage and current that maximizes the amount of power generated by the Perovskite solar cell part 12, supporting efficient power generation. The power conditioner 28 has a function of sending the generated power at an appropriate voltage when the power is sold to a power company. This prevents the reverse flow of power and ensures a stable power supply. The power conditioner 28 has the function of cutting off the output in the event of a power outage or abnormality to prevent accidents. This ensures safe operation of the solar power generation system.

The distribution board 30 has the function of distributing power generated in the Perovskite solar cell part 12 and power supplied from a power company to devices and rooms in the home. The distribution board 30, incorporating a breaker that detects electric leakage or overcurrent and cuts off the electricity, has the function of preventing fires and electric shock accidents. The distribution board 30 has the function of reversing flow of power when surplus power from the Perovskite solar cell part 12 is sold to a power company. This allows efficient utilization of the generated power.

The storage battery 32 stores the power generated in the Perovskite solar cell part 12, thereby enabling utilizing the electricity even during times, such as at night or on cloudy days, when photovoltaic power generation is not available. The storage battery 32 serves to stabilize the supply of power. This enables a stable power supply even in areas where the power supply is unstable.

The storage battery 32 stores the power generated in the Perovskite solar cell part 12, thereby reducing the amount of electricity purchased from a power company and saving on electricity bills. The storage battery 32 can supply power for a certain period of time by utilizing the stored power during a power outage.

For the storage battery 32, for example, a lithium-ion secondary battery may be utilized, but other secondary batteries, such as a nickel-metal hydride storage battery, may of course be utilized.

Here, a configuration including the Perovskite solar cell part 12, the tempered glass part 16, the junction box 26, the power conditioner 28, the distribution board 30, and the storage battery 32 is referred to as a solar power generation system 8.

The operation of the solar energy utilization system 10 having the above-described configuration will now be explained. First, a comparison will be made between silicon-based photovoltaic power generation and the Perovskite solar cell part 12. As illustrated in FIG. 3B, the Perovskite solar cell part 12 efficiently absorbs sunlight in the visible light range (380 to 780 nm), enabling power generation even under cloudy or rainy conditions.

FIGS. 4A and 4B represent a comparison of power generation in Tokyo under different weather conditions on one day between with the Perovskite solar cell part 12 and in conventional silicon-based photovoltaic power generation. As described above, on a normal sunny day, larger amount of power is generated in the conventional silicon-based photovoltaic power generation, but on a cloudy or rainy day, with the Perovskite solar cell part 12, about three times more power is generated than in the conventional type. According to annual weather comparisons, half of the days are sunny and half are not sunny (cloudy or rainy), so the total annual power generation does not vary greatly.

Figure 3C:
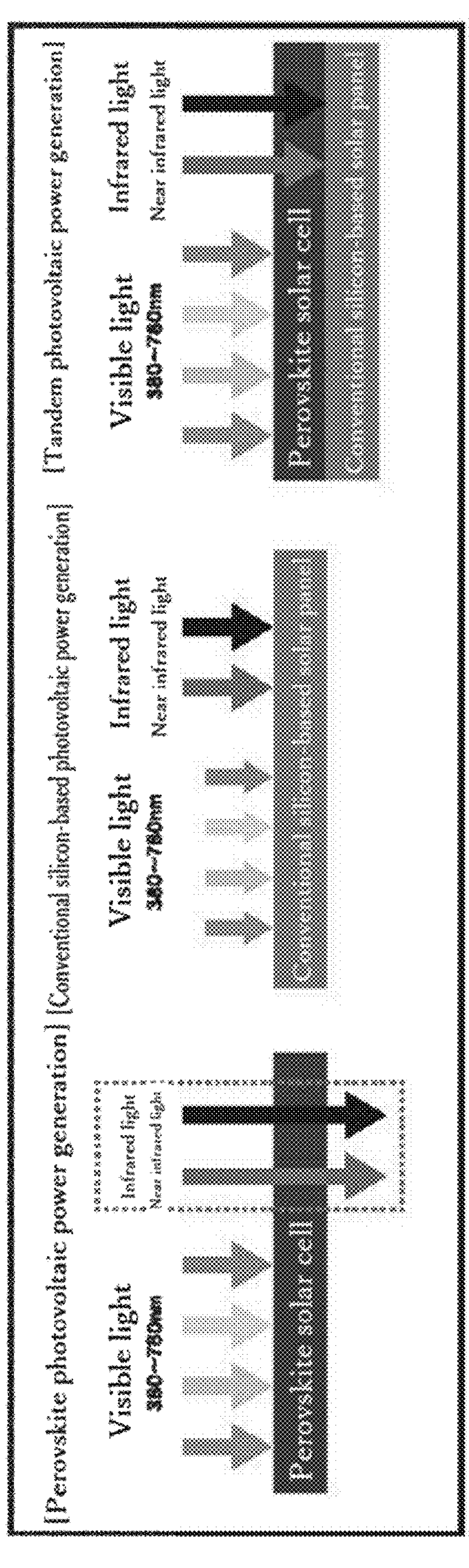

FIGS. 3A to 3C are diagrams representing the relationship between the wavelength and spectrum of light absorbed in conventional silicon-based photovoltaic power generation. As stated above, as illustrated in FIGS. 3A and 3C, silicon-based photovoltaic power generation absorbs not only visible light in the range of 380 to 780 nm, but also infrared light.

As stated above, the Perovskite solar cell part 12 absorbs sunlight in the visible light range (380 to 780 nm) and absorbs almost no sunlight in the infrared range. In conventional silicon-based photovoltaic power generation, sunlight in the infrared range is absorbed as well, making it difficult to absorb sunlight as solar heat.

In contrast, according to the solar energy utilization system 10 of the embodiment involving the present invention, the Perovskite solar cell part 12 allows sunlight energy in the infrared range to pass through, so that the solar water heater heat-collection plate 14 can efficiently absorb thermal energy, enabling absorption of approximately six times the amount of heat compared to silicon-based photovoltaic power generation.

Generally, the solar water heater 6 supplies thermal energy, is utilized for hot-water supply and heating, is of 40 to 60% energy efficiency, and is applicable to buildings with high demand for hot-water supply such as hospitals, hotels, welfare facilities, and schools, being of 600 kW/m2 energy supply per unit area. In contrast, the solar power generation system 8 supplies electric energy, is utilized for electrical appliances and for selling to power companies, is of 7 to 18% energy efficiency, and is installable in various applicable buildings, being of 130 kW/m2 energy supply per unit area.

In this way, the energy efficiency of the solar water heater 6 is better than that of the solar power generation system 8, but conventionally, vacuum tubes have been required to prevent the heat obtained from sunlight from being dissipated. However, vacuum tubes have problems in that they are expensive and fragile. Also, because conventional solar water heaters use water, there have been problems with durability and excessive weight (200 to 400 kg). In addition, because water is used, even when antifreeze is added, the water will freeze in winter in cold regions, which means that installation in these regions is not possible.

In addressing such issues, the solar energy utilization system 10 according to the embodiment involving the present invention demonstrates a remarkable effectiveness. Specifically, by replacing water with oil, there are no problems such as rust, and because oil does not freeze (approximately −60° C.), it can be employed in cold regions, and also, because only a small amount of oil is circulating, the problem of excess weight is solved (weight: approximately 20 to 50 kg).

In the solar energy utilization system 10, the circulating oil flows through the large pipe 18*a*, then through the medium pipes 18*b* that constitute a large mesh, and also through the small pipes 18*c* that constitute a fine mesh, so that as illustrated in FIGS. 2A and 2B, the oil flows and spreads within the area on the reverse surface of the solar water heater heat-collection plate 14. As a result, because oil circulates within the device, there is almost no problem with heat dissipation, and the heat pump 22 has good thermal efficiency even at low temperatures, enabling for maintaining hot water of constant high temperature in the insulated hot water tank 24.

In this way, by utilizing a solar water heater that uses oil, the energy from sunlight can be used efficiently. The thermal conversion efficiency is as high as at approximately 40 to 60%. With water, pipes will deteriorate due to rust and limescale, so their durability is only about 10 years, whereas with oil, pipes are resistant to corrosion such as rust and their durability is about 20 to 30 years.

Water freezes (at about 0° C.) in cold regions, but oil (at about −60° C.) has less risk of freezing. With the specific heat of oil being about half that of water, heat is absorbed faster and oil circulates with good heat exchange efficiency even at low temperatures in the heat pump 22.

Water expands at high temperatures (about 100° C.), but oil (about 400° C.) does not undergo thermal expansion, so there is less risk of accidents. Even a small amount of oil circulates through the solar water heater 6 with efficient heat exchange, so the total weight of the device when installed on the roof is light.

As described above, according to the solar energy utilization system 10, the Perovskite solar cell part 12 can generate more power from sunlight in the visible light range (380 to 780 nm) than conventional silicon-based photovoltaic power generation, and at the same time, since it allows sunlight in the infrared range to pass through, heat can be obtained at the solar water heater heat-collection plate 14, which has the advantage of enabling absorption of approximately six times the amount of heat compared to conventional silicon-based photovoltaic power generation.

Furthermore, the solar water heater 6 heats water absorbed by the heat pump 22, and sends the water to the insulated hot water tank 24 for storing. This stored hot water is employed for hot-water supply, underfloor heating, water heating for baths, and the like. Furthermore, the power generated in the Perovskite solar cell part 12 is sent to the power conditioner 28 and the distribution board 30, and then to household electrical appliances and the storage battery 32.

The above-described components configuring the solar energy utilization system 10 are examples, which can be modified as appropriate. For example, the solar water heater 6 has been described as utilizing the heat pump 22, but a normal heat exchanger may also be used.

DESCRIPTION OF REFERENCE NUMERALS

6: Solar water heater, 8: Solar power generation system, 10: Solar energy utilization system, 12: Perovskite solar cell part, 13: Air layer, 14: Solar water heater heat-collection plate, 16: Tempered glass part, 18: Flow path part, 18*a*: Large pipe, 18*b*: Medium pipe, 18*c*: Small pipe 20: Casing, 22: Heat pump, 24: Insulated hot water tank, 26: Junction box, 28: Power conditioner, 30: Distribution board, 32: Storage battery

The invention claimed is:

1. A solar energy utilization system comprising:

a Perovskite solar cell part that converts light energy of sunlight into electrical energy;

a solar water heater heat-collection plate that is disposed below the Perovskite solar cell part, that collects heat obtained from the sunlight that has passed through the Perovskite solar cell part, and that is constituted from black aluminum;

a casing for housing the Perovskite solar cell part and the solar water heater heat-collection plate;

an air layer that is provided within the casing between a tempered glass part on which the Perovskite solar cell part is placed and the solar water heater heat-collection plate; and a flow path part that is provided in the casing in contact with the solar water heater heat-collection plate, and that allows fluid to flow to exchange heat collected by the solar water heater heat-collection plate; wherein the flow path part, being a flow path that spreads throughout an entire area of the solar water heater heat-collection plate, has a large pipe that extends to left and right in a plan view, functioning as a main pipe, medium pipes that extend vertically and horizontally, constituting a larger mesh lattice, and small pipes that extend vertically and horizontally, constituting a smaller mesh lattice, and fluid flowing through the large pipe, the medium pipes, and the small pipes is oil.

* * * * *